Aug. 20, 1957

A. WRIGHT 2,803,139

TELEVISION TUNER CONTROL MECHANISM

Filed Oct. 20, 1954

2 Sheets-Sheet 1

INVENTOR.
ANTONY WRIGHT

BY

Campbell, Brumbaugh, Free & Graves his ATTORNEYS

Aug. 20, 1957 A. WRIGHT 2,803,139

TELEVISION TUNER CONTROL MECHANISM

Filed Oct. 20, 1954 2 Sheets-Sheet 2

INVENTOR.
ANTONY WRIGHT
BY
Campbell, Brumbaugh, Free & Graves
his ATTORNEYS.

United States Patent Office 2,803,139

Patented Aug. 20, 1957

2,803,139

TELEVISION TUNER CONTROL MECHANISM

Antony Wright, Port Washington, N. Y., assignor to Columbia Broadcasting System, Inc., New York, N. Y., a corporation of New York Application October 20, 1954, Serial No. 463,495

4 Claims. (Cl. 74—10.5)

This invention relates to an improved apparatus for tuning television receivers, and has particular reference to a tuning mechanism providing a linearly movable control knob for performing the dual tuning function required in such receivers.

The majority of television receivers employ rotary switch or turret type tuners which carry two concentric control knobs, one for channel switching and one for fine tuning within a selected channel. In its best form, this configuration renders it somewhat difficult to rapidly and easily tune to a selected channel. Further, these mechanisms fail to indicate the selected channel with sufficient clarity to be visible any distance from the receiver.

The concentric knob arrangement severely limits television receiver designers by necessitating the positioning of these control knobs adjacent to the R.-F. tuner in a similar manner in each set. Thus, conventional television sets today have two sets of control knobs usually placed on the left and right hand sides of the set, the knobs on the left hand side controlling contrast and sound volume and the knobs on the right selecting the channel and providing for fine tuning. With the tuner mounted in such a conventional manner, considerable space on the front of the set is required which necessarily enlarges the television receiver.

Accordingly, it is an object of the present invention to provide television receiver tuning apparatus permitting the disposition of the control knobs in a convenient position remote from the tuner.

It is another object of the invention to provide tuning mechanism of the above character in which a single shaft may be shifted linearly for channel tuning and rotated for fine tuning within each channel.

It is yet another object of the invention to provide tuning mechanism of the above character which permits utilizing practically the entire front of a television receiver for the picture tube.

It is still a further object of the invention to provide tuning mechanism of the above character which clearly indicates the selected channel at remote positions from the television receiver.

These and further objects of the invention are accomplished by positioning a knob on a linearly movable lever and providing pulley means for connecting the tuner to the lever. Control means provided on the lever adjacent to the knob facilitates the selection of a desired channel while suitable indicia disposed behind such knob clearly indicates the selected channel. Additional pulley means on the lever connected to the tuner permit fine tuning upon rotation of the tuning control knob.

In a preferred embodiment of the invention, a drive cable is affixed by a bracket to the rotatable and linearly movable lever and supported by a pair of idler pulleys in its path to the tuner. A laterally extending tuning assist cable cooperates with a control pulley on the lever to aid in tuning between adjacent or relatively closely spaced channels. Mounted on the lever is a further pulley carrying a cord extending directly to the fine tuning element in the tuner.

These and further objects and advantages of the invention will be more readily understood when the following description is read in connection with the accompanying drawings in which.

Figures 1, 3, 4, 5:
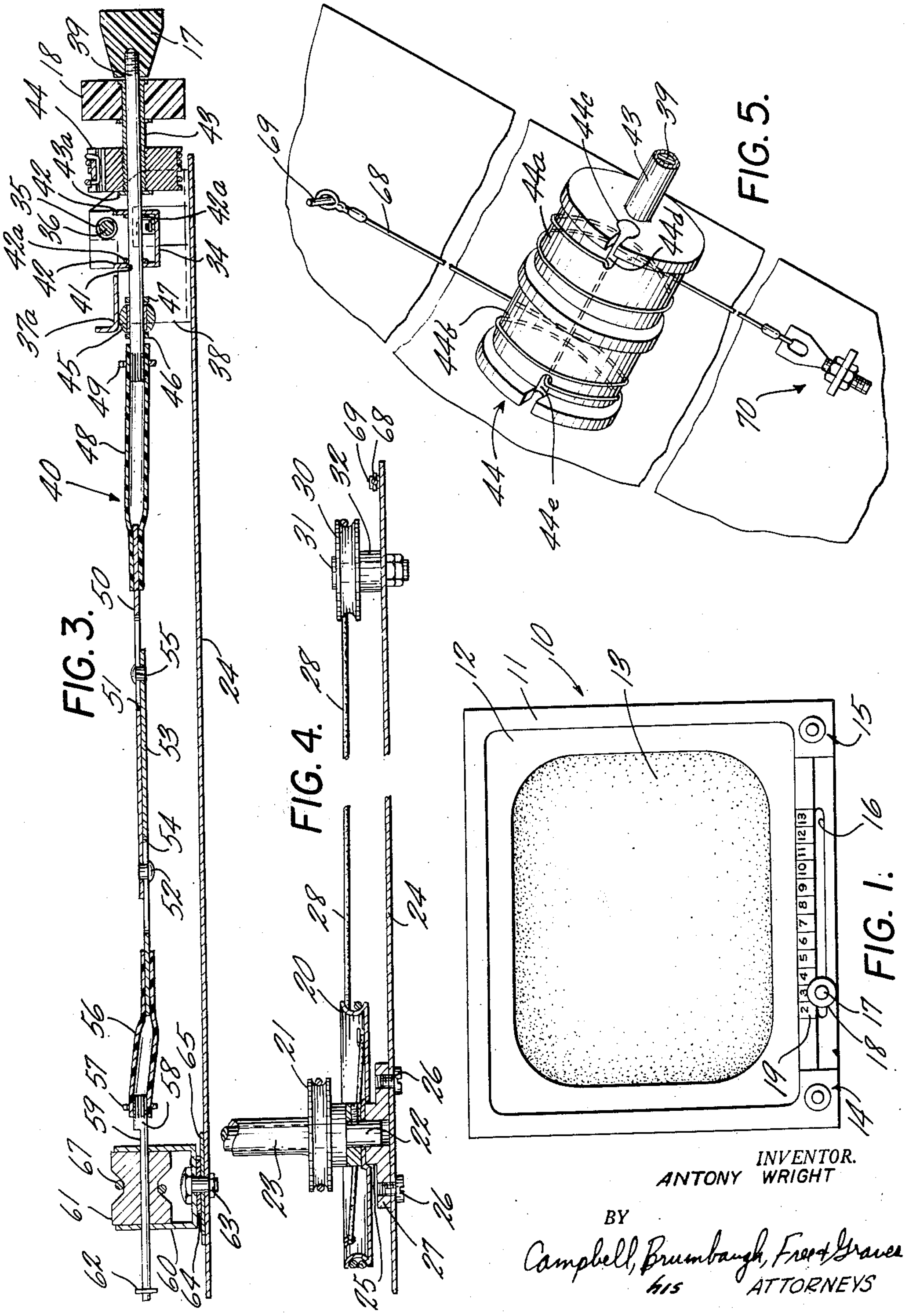
Figure 1 is a front view of a television receiver employing a tuning mechanism constructed in accordance with the present invention.
Figure 3 is a longitudinal section of the mechanism illustrated in Figure 2 taken along the tuning lever on the view line 3—3 looking in the direction of the arrows.
Figure 4 is a longitudinal section of the mechanism illustrated in Figure 2 taken on the view line 4—4 looking in the direction of the arrows.
Figure 5 is a perspective view of a control pulley used in the mechanism of Figure 2.

Referring to a typical embodiment of the invention with particular reference to Figure 1, a television receiver 10 comprises a cabinet 11 carrying a mask 12 outlining a picture tube 13. Mounted at the lower front of the cabinet 11 are control knobs 14 and 15 for contrast and sound control and the like and positioned between such controls in front of a lateral slot 16 are tuning knobs 17 and 18. Behind the knob 18 is disposed indicia 19 designating the various television channels.

Figure 2:
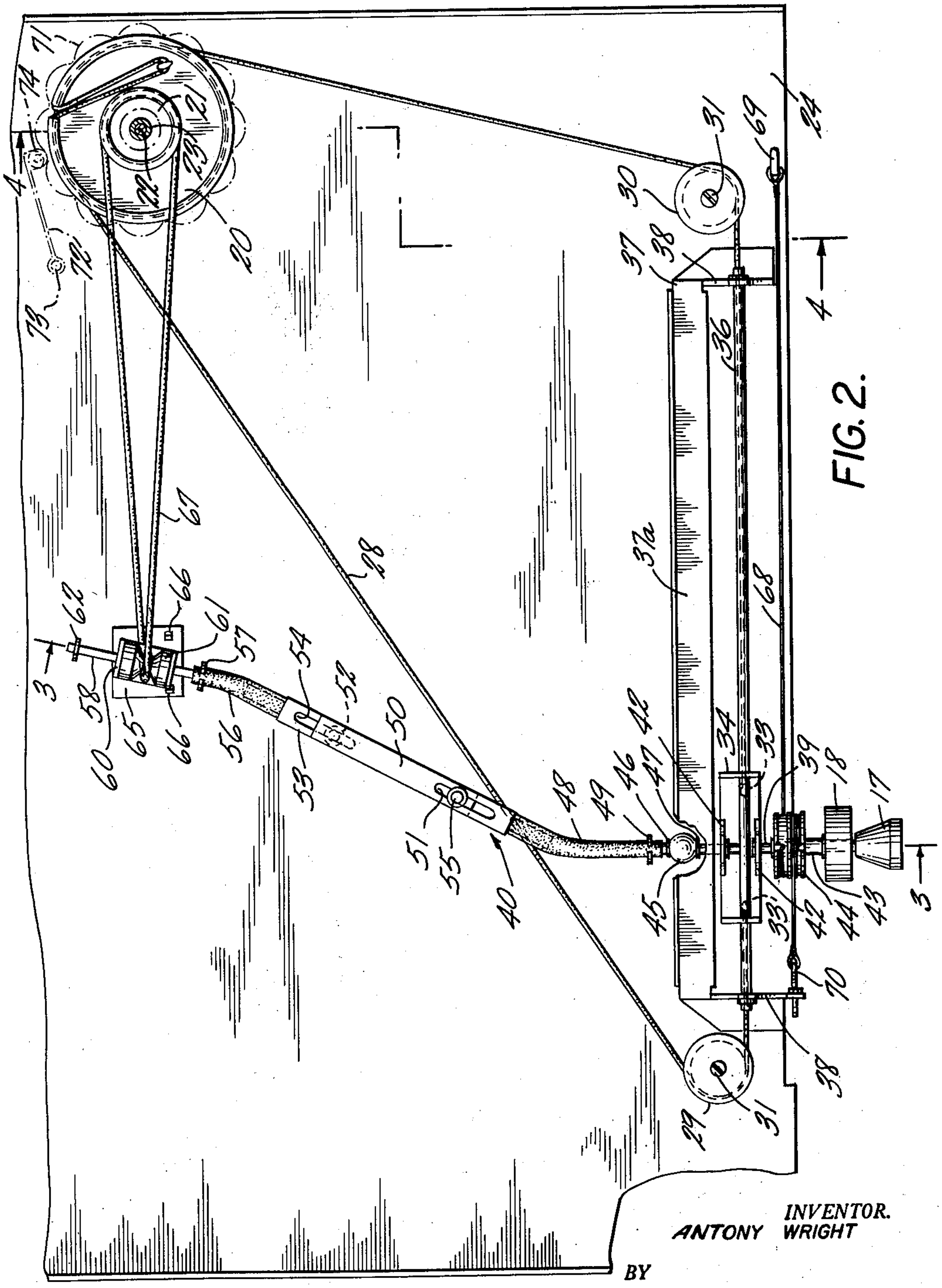
Figure 2 is a plan view, partially broken away, of the television tuning mechanism used in the receiver shown in Figure 1.

Turning to Figures 2, 3 and 4 which illustrate the tuning mechanism in some detail, a radio frequency (R.-F.) tuner (not shown) carries a channel tuning pulley 20 and a fine tuning pulley 21 on its concentric tuning shafts 22 and 23, respectively. The tuner may be mounted on a base plate 24 and the shafts 22 and 23 supported from the tuner. Alternatively, additional support may be provided by journaling the pulley 20 and the shaft 22 on a bearing 25 fastened by screws 26 and a flange 27 to the base 24.

Conventional practice in the past required that the concentric shafts 22 and 23 be directly controlled by knobs placed thereon. This necessitated the positioning of the R.-F. tuner at a particular location so that the shafts 22 and 23 extended through an opening in the front or side of a television receiver. However, in the present tuning mechanism, the pulley 20 is rotated by means of a cable 28 suitably wound thereon, such cable extending around a pair of idler pulleys 29 and 30 adjustably mounted by screws 31 and stand-off collars 32 in slots (not shown) on the base plate 24. The cable 28 is fastened at its ends to tabs 33 on a U-shaped bracket 34 slidably mounted by openings 35 on a laterally extending rod 36. An elongated laterally extending bracket 37 affixed to the base 24 includes sides 38 to suitably anchor the rod 36.

A front section 39 of a tuning lever 40 comprises a rod carrying the knob 17 on its outward end. The rod 39 passes through openings 41 in two upwardly extending side plates 42 formed on the bracket 34, lock washers 42*a* preventing axial movement of the rod 39.

Rotatably mounted on the rod 39 between the knob 17 and the bracket 34 is a sleeve 43 carrying a control pulley 44, described in greater detail below, and the knob 18. A lock washer 43*a* on the rod 39 suitably locates the sleeve 43. Positioned on the portion of the rod 39 on the other side of the bracket 34 is a rotatable bead 45 retained on the rod 39 by a pair of lock washers 46 and 47. The bead 45 engages the underside of a flat laterally extending bearing strip 37*a* joining the sides 38 to form the bracket 37.

The end of the rod 39 remote from the knob 17 is splined and carries a flexible plastic tube 48 secured thereto by means of a clamping washer 49. The other end of the plastic tube 48 slips over the end of a thin bar 50 provided with a slot 51 and a rivet 52 on opposite ends thereof. The bar 50 cooperates with a similar bar 53 formed with a slot 54 and carrying a rivet 55 on opposite ends, as clearly shown in Figure 3. The rivets 52 and 55 are slidably mounted in the slots 54 and 51, respectively. It will be evident that this arrangement permits the bars 50 and 54 to slide relatively to each other to increase or decrease the length of the tuning lever 40.

A second plastic tube 56 fits over one end of the bar 53 and is joined by a clamp washer 57 to a splined rod 58 flattened at 59 to fit through correspondingly shaped openings in a U-shaped bracket 60 and a pulley 61 disposed therein. The rod 59 is retained in its operating position by a lock washer 62 disposed on its end.

The U-shaped bracket 60 is mounted on the base 24 by a nut and bolt combination 63 extending therethrough, a washer 64 and a plate 65 being disposed between the base 24 and the bracket 60. The plate 65 is secured to the base 24 and upwardly extending tabs 66 are formed thereon to limit the angular movement of the bracket 60, as shown in Figure 2. A cord 67 extends around the pulley 61 and the pulley 21 for fine tuning adjustment.

Examining the control pulley 44 and associated apparatus in greater detail with particular reference to Figures 2, 3 and 5, a cable 68 is fastened to a tab 69 on the base 24 at one side of the bracket 37 and to the head of an adjustable screw 70 fastened to the side 38 at the other side of the bracket 37. The pulley 44 is formed with front and rear cable receiving sections **44*a* and 44*b*, respectively, and is provided with an opening 44*c* extending axially of the pulley 44 and communicating with the sections 44*a* and 44*b* through slots 44*d* and 44*e*, respectively. The diameter of the pulley 44 is determined, of course, by the maximum torque that must be exerted for rotation thereof. The distance the lever 40 moves then determines the number of turns of the cable 68 on the pulley 44**.

The pulley 44 is shown in Figure 5 at an intermediate position with respect to the bracket 37, the cable 68 being wound one and three quarter times around each of the sections **44*a* and 44*b* and joined through the axial opening 44*c*. It will be apparent that as the lever 40 is shifted towards one extremity as in Figure 2, there will be a greater number of turns on section 44*a* than on section 44*b***.

In order to facilitate tuning to a predetermined position in each channel, it is necessary that a snap action stop mechanism be associated with the rotating tuning elements to enable the operator to feel when any channel is reached. In this instance, a circular cam 71, as shown in phantom outline in Figure 2, rotates with the elements found in the tuner (not shown) and comprises 12 segments. A resilient arm 72 is rigidly mounted at a point 73 in a manner such that a roller 74 on the end thereof is strongly urged against the cam 71. Thus, the tuner will be snapped into the various channels as the shaft 22 is rotated.

The operation of the tuning mechanism constructed in accordance with the present invention is self-evident. Thus, the knob 17 may be grasped and the tuning lever 40 swept from, for example, channel 2 to channel 12 in a single motion. Subsequently, the knob 17 may be rotated to touch up the tuning within the selected channel. On the other hand, if it is desirable to switch between, for example, channels 2 and 3, the knob 18 may be rotated. This results in rotation of the pulley 44, which, due to the cable 68, moves the lever 40 over one channel and, through the cable 28, readjusts the tuner.

It is apparent that the position of the knobs 17 and 18 and therefore, the selected channel, will be clearly indicated by the indicia 19, as shown in Figure 1. This feature not only facilitates the actual tuning function but also serves to clearly indicate the selected channel to persons remote from the receiver 10.

Accordingly, it is apparent that the present invention permits simplified tuning of a television receiver by converting the rotary tuning motion to a linear motion for channel selection. This permits the tuning lever 40 to be swept across a number of channels, such lever also being rotatable for fine tuning within a selected channel.

It will be understood that the above-described embodiments of the invention are illustrative only and modifications thereof will occur to those skilled in the art. Therefore, the invention is not to be limited to the specific apparatus disclosed herein but is to be defined by the appended claims.

I claim:

1. Tuning mechanism for rotating a pair of tuner shafts comprising laterally movable angular rotatable lever means mounted at a point, means connecting said lever means to one of said shafts to provide for rotation thereof upon lateral movement of said lever means, a pulley on said lever means adjacent to said mounting point, means connecting said pulley to the other of said shafts to provide for rotation thereof upon rotation of said lever means, an actuating pulley rotatably mounted on the lever means remote from the mounting point, and cable means secured at laterally spaced points from said actuating pulley and wound thereon so that rotation of said actuating pulley laterally shifts said lever means.

2. Tuning mechanism for rotating a pair of tuner shafts comprising a flexible and extensible lever rotatably mounted at a point, a laterally movable bracket remote from the mounting point for supporting the lever, drive means connecting said bracket to one of said shafts to provide for rotation thereof upon lateral movement of said lever, a pulley on said lever adjacent to said mounting point, means connecting said pulley to the other of said shafts to provide for rotation thereof upon rotation of said lever, an actuating pulley rotatably mounted on said lever adjacent to said bracket, and cable means secured at laterally spaced points from said actuating pulley and wound thereon so that rotation of said actuating pulley laterally shifts the lever.

3. Tuning mechanism for rotating a pair of tuner shafts each carrying a pulley comprising a flexible and extensible substantially longitudinally extending lever rotatably mounted at a point, a laterally movable bracket remote from the mounting point for supporting the lever, cable means connecting said bracket to the pulley on one of said tuner shafts to provide for rotation thereof upon lateral movement of said bracket, a third pulley on said lever adjacent to the mounting point, a cord connecting said third pulley to the pulley on the other of said shafts to provide for rotation thereof upon rotation of said lever, an actuating pulley rotatably mounted on the lever adjacent to said bracket, and cable means secured at laterally spaced points from said actuating pulley and wound thereon so that rotation of said acutating pulley laterally shifts the lever.

4. Television tuning mechanism for rotating a channel selector shaft associated with snap action means and a fine tuning shaft each carrying a pulley comprising a flexible and extensible substantially longitudinally extending lever rotatably mounted at a pivot point, a laterally extending guide rod disposed remote from the pivot point, a bracket slidably mounted on the guide rod for supporting the lever, a knob on the bracket end of the lever to facilitate lateral and angular movement thereof, cable means connecting said bracket to the pulley on the selector shaft to provide for rotation thereof upon lateral movement of said bracket, a third pulley on said lever adjacent to the pivot point, a cord connecting said third pulley to the pulley on the fine tuning shaft to provide for rotation thereof upon rotation of said lever, an actuating pulley rotatably mounted on the lever adjacent to the bracket, and cable means secured at laterally spaced points from said actuating pulley and wound thereon so that rotation of said actuating pulley laterally shifts the lever.

References Cited in the file of this patent

UNITED STATES PATENTS

| | | |
|---|---|---|
| 1,841,941 | Elliott | Jan. 19, 1932 |
| 2,122,306 | Voltz et al. | June 28, 1938 |
| 2,397,435 | Richards | Mar. 26, 1946 |
| 2,558,454 | Nienaber et al. | June 26, 1951 |

FOREIGN PATENTS

| | | |
|---|---|---|
| 737,368 | France | Oct. 3, 1932 |